(12) United States Patent
Huang et al.

(10) Patent No.: US 10,418,279 B2
(45) Date of Patent: Sep. 17, 2019

(54) METHOD OF FORMING CONTACT METAL

(71) Applicant: TAIWAN SEMICONDUCTOR MANUFACTURING CO., LTD., Hsin-Chu (TW)

(72) Inventors: Chun-Hsien Huang, Hsinchu (TW); Hong-Mao Lee, Hsinchu (TW); Hsien-Lung Yang, Taipei (TW); Yu-Kai Chen, Taipei (TW); Wei-Jung Lin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 169 days.

(21) Appl. No.: 15/628,267

(22) Filed: Jun. 20, 2017

(65) Prior Publication Data
US 2017/0287779 A1    Oct. 5, 2017

Related U.S. Application Data

(63) Continuation of application No. 15/063,905, filed on Mar. 8, 2016, now Pat. No. 9,711,402.

(51) Int. Cl.
*H01L 21/78* (2006.01)
*H01L 21/768* (2006.01)
*H01L 21/8238* (2006.01)

(52) U.S. Cl.
CPC .. *H01L 21/76895* (2013.01); *H01L 21/76805* (2013.01); *H01L 21/76807* (2013.01); *H01L 21/76843* (2013.01); *H01L 21/76889* (2013.01); *H01L 21/823814* (2013.01); *H01L 21/823821* (2013.01); *H01L 21/823871* (2013.01)

(58) Field of Classification Search
CPC ....... H01L 29/772–8128; H01L 29/785; H01L 29/66477; H01L 29/665; H01L 29/66795; H01L 29/456; H01L 21/02186; H01L 21/76843; H01L 21/76889; H01L 21/823814; H01L 21/76895; H01L 21/76807; H01L 21/823871; H01L 21/823821; H01L 21/76805
See application file for complete search history.

(56) References Cited

U.S. PATENT DOCUMENTS

| 4,508,430 | A | * | 4/1985 | Freller | G02F 1/1523 359/266 |
|---|---|---|---|---|---|
| 5,858,875 | A | | 1/1999 | Chung | |
| 6,211,048 | B1 | * | 4/2001 | Hwang | H01L 29/665 257/E21.438 |
| 6,344,288 | B1 | * | 2/2002 | Oyama | G02B 1/116 428/701 |
| 7,473,637 | B2 | | 1/2009 | Kraus | |
| 7,667,271 | B2 | | 2/2010 | Yu et al. | |
| 7,910,453 | B2 | | 3/2011 | Xu et al. | |
| 8,377,779 | B1 | | 2/2013 | Wang | |

(Continued)

*Primary Examiner* — Charles D Garber
*Assistant Examiner* — S M Sohel Imtiaz
(74) *Attorney, Agent, or Firm* — Haynes and Boone, LLP

(57) ABSTRACT

A semiconductor device is disclosed. The device includes a source/drain feature formed over a substrate. A dielectric layer formed over the source/drain feature. A contact trench formed through the dielectric layer to expose the source/drain feature. A titanium nitride (TiN) layer deposited in the contact trench and a cobalt layer deposited over the TiN layer in the contact trench.

20 Claims, 15 Drawing Sheets

(56) References Cited

U.S. PATENT DOCUMENTS

| | | |
|---|---|---|
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,219,062 B2 | 12/2015 | Zeitzoff |
| 9,373,680 B1 | 6/2016 | Lee |
| 9,396,995 B1 | 7/2016 | Patil |
| 2002/0068429 A1 | 6/2002 | Trivedi |
| 2003/0156460 A1* | 8/2003 | Wu ................... H01L 27/115 365/185.33 |
| 2004/0038517 A1* | 2/2004 | Kang ............... H01L 21/28518 438/630 |
| 2006/0027805 A1* | 2/2006 | Koo .................. H01L 51/0021 257/59 |
| 2007/0069385 A1 | 3/2007 | Oates |
| 2008/0283897 A1* | 11/2008 | Ding ............... H01L 21/28061 257/316 |
| 2008/0296666 A1 | 12/2008 | Iijima |
| 2009/0057778 A1* | 3/2009 | Dreeskornfeld .. H01L 27/10876 257/392 |
| 2010/0155846 A1 | 6/2010 | Mukherjee |
| 2010/0181630 A1* | 7/2010 | Bu .................... H01L 21/28079 257/410 |
| 2012/0139015 A1 | 6/2012 | Yu |
| 2012/0175626 A1 | 7/2012 | Erickson et al. |
| 2012/0329234 A1 | 12/2012 | Porter |
| 2013/0248999 A1* | 9/2013 | Glass ..................... H01L 29/36 257/335 |
| 2014/0001520 A1 | 1/2014 | Glass |
| 2014/0001574 A1 | 1/2014 | Chen et al. |
| 2014/0110755 A1 | 4/2014 | Colinge |
| 2014/0124842 A1 | 5/2014 | Wang |
| 2014/0151812 A1 | 6/2014 | Liaw |
| 2014/0183645 A1 | 7/2014 | Wann |
| 2015/0008488 A1* | 1/2015 | Hall ................. H01L 29/66636 257/288 |
| 2015/0279970 A1 | 10/2015 | Zhang |
| 2015/0372143 A1* | 12/2015 | Bae .................... H01L 29/7848 257/401 |
| 2016/0104787 A1* | 4/2016 | Kittl .................... H01L 29/665 438/283 |
| 2016/0163824 A1* | 6/2016 | Shin ................. H01L 29/66545 257/368 |
| 2016/0336227 A1* | 11/2016 | Chen ................ H01L 21/76895 |
| 2016/0343821 A1* | 11/2016 | Chiou ................. H01L 29/458 |
| 2018/0248011 A1* | 8/2018 | Mehandru ......... H01L 29/78618 |

\* cited by examiner

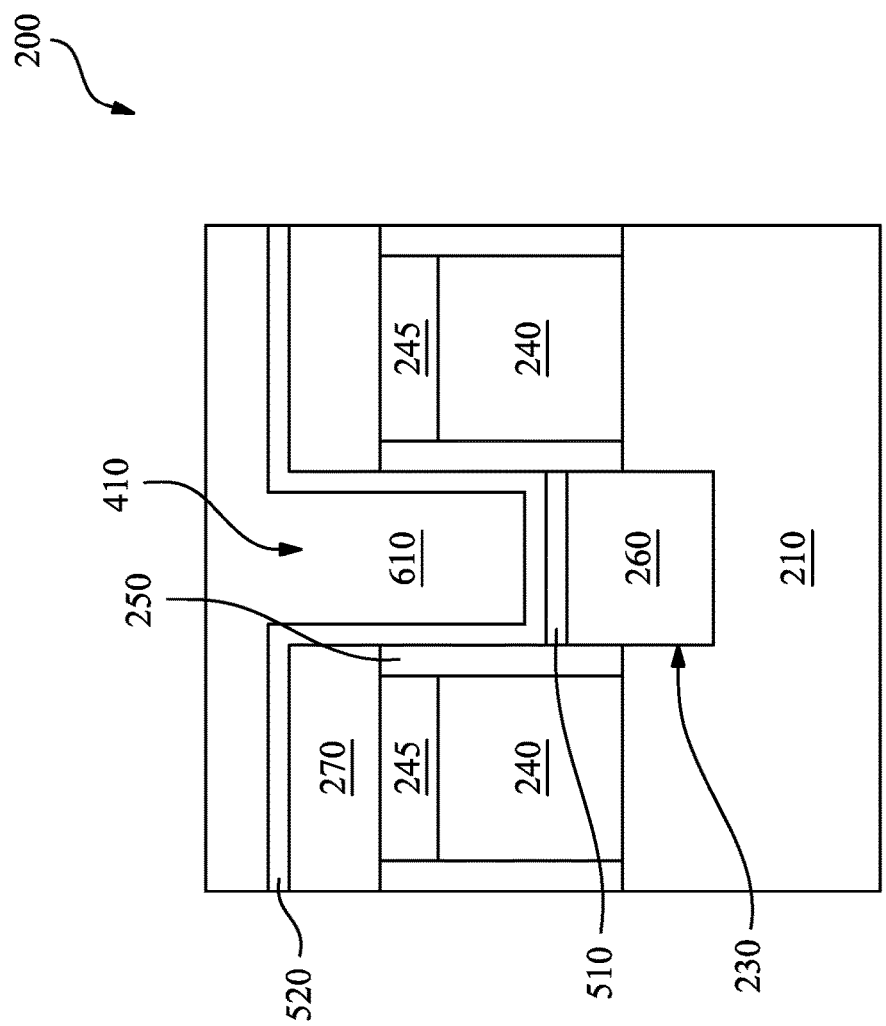

METHOD OF FORMING CONTACT METAL

PRIORITY CLAIM

This application is a continuation of U.S. patent application Ser. No. 15/063,905, filed on Mar. 8, 2016, which is incorporated herein by reference in its entirety.

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, improvements in the process of forming of a contact metal in a FinFET device are desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 3A, 3B, 4A, 4B, 5A, 5B, 6A, 6B, 7A, 7B, 8A and 8B are cross-sectional views of an example semiconductor device in accordance with some embodiments, along the line A-A in FIG. 2A.

DETAILED DESCRIPTION

Figure 1:
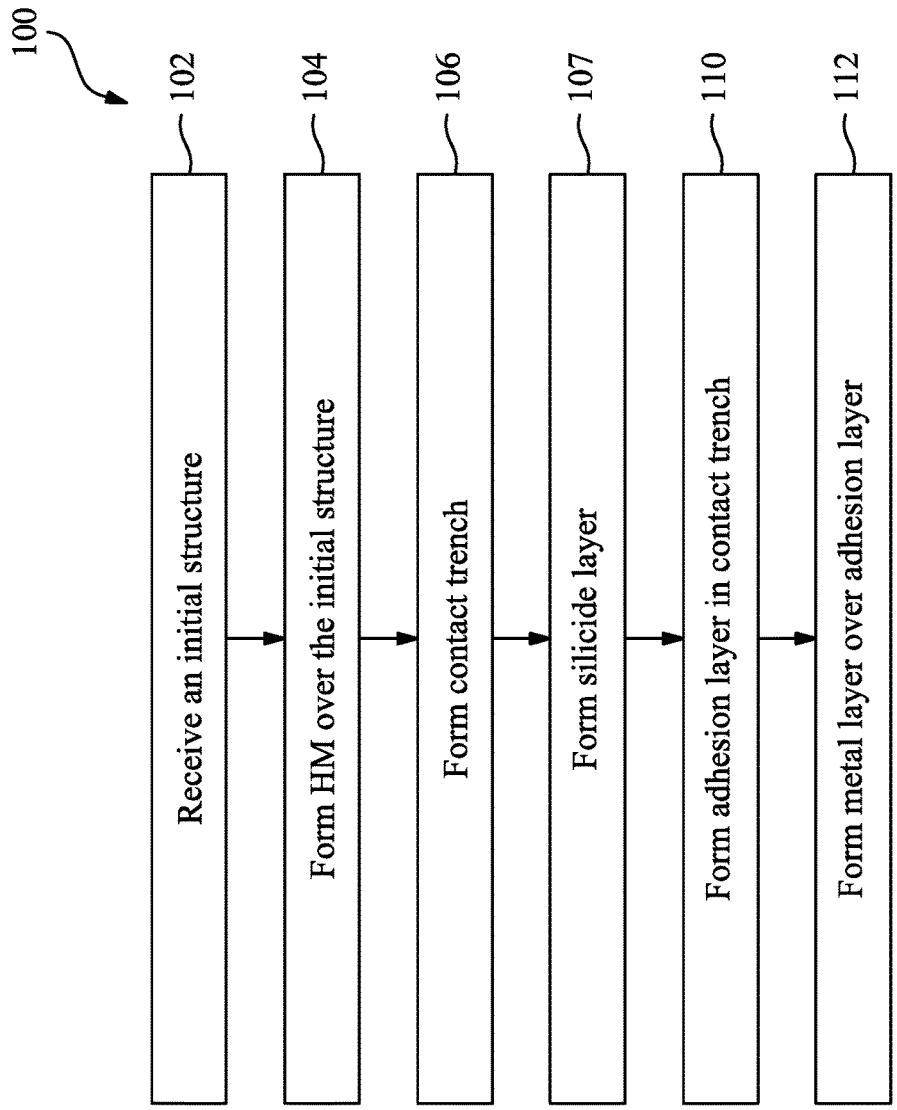
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. The following disclosure will continue with a FinFET example to illustrate various embodiments of the present invention. It is understood, however, that the application should not be limited to a particular type of device, except as specifically claimed.

FIG. 1 is a flowchart of a method 100 of fabricating one or more semiconductor devices in accordance with some embodiments. The method 100 is discussed in detail below, with reference to an initial structure 205 of a semiconductor device 200 showed in FIGS. 2A and 2B, and the semiconductor device 200 shown in FIGS. 3A through 8B.

Figure 2A:
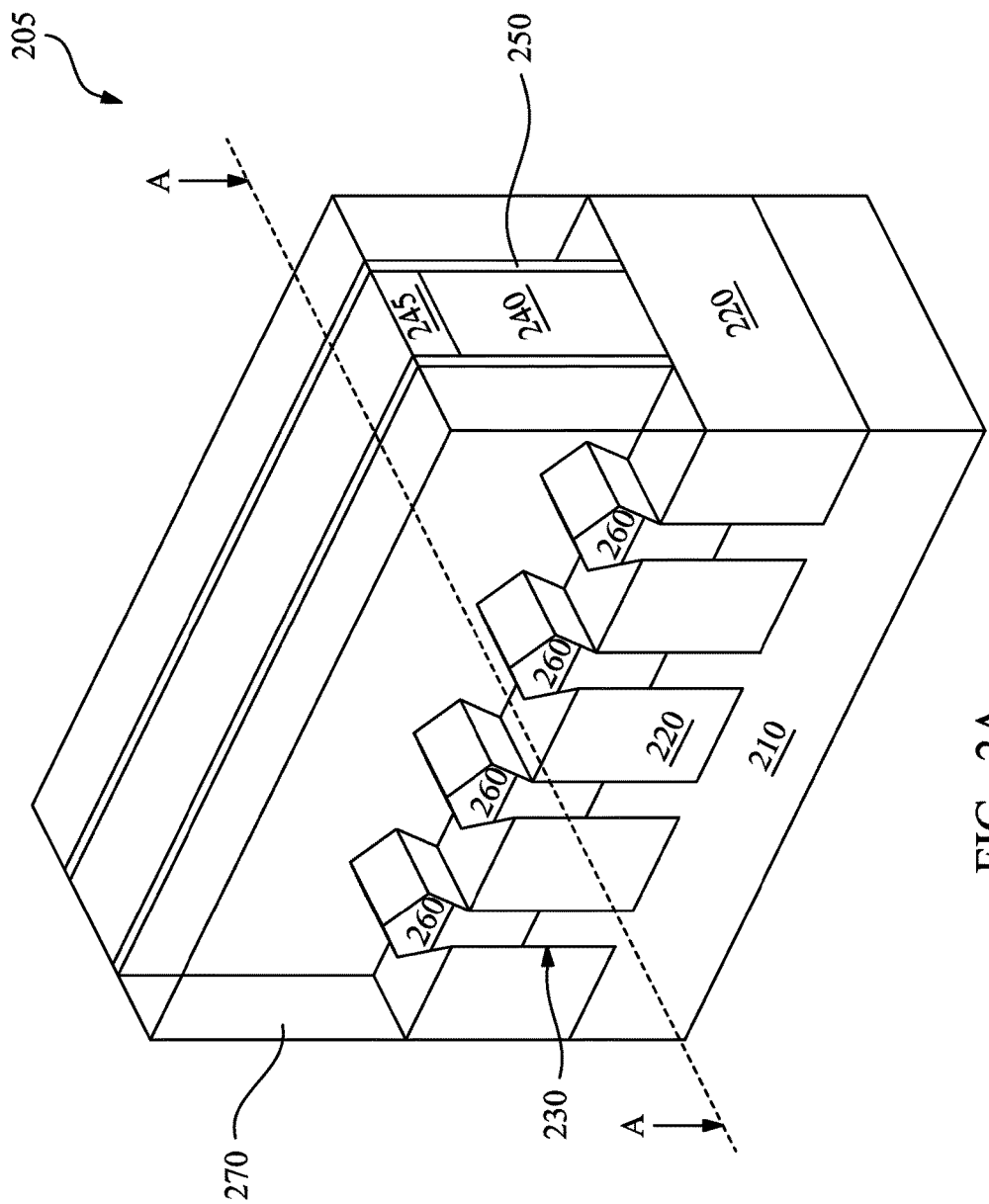
FIG. 2A is a diagrammatic perspective view of an initial structure of an example semiconductor device in accordance with some embodiments.
Figure 2B:
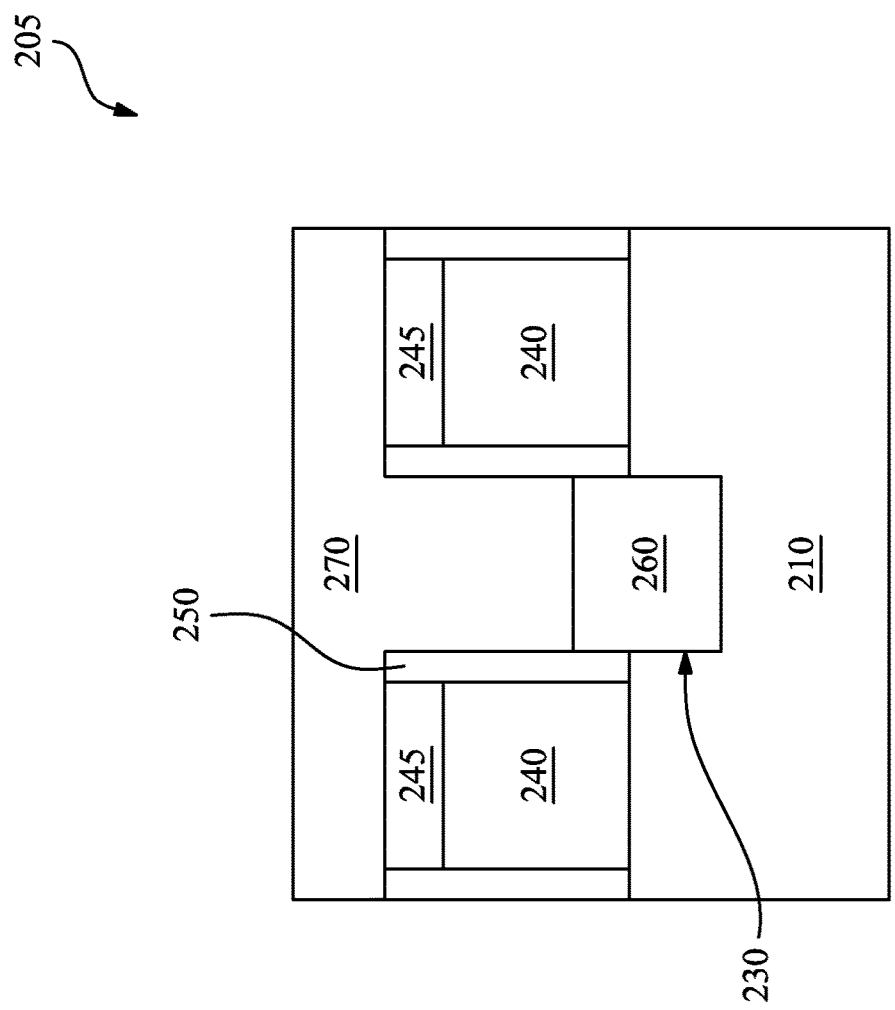
FIG. 2B is a cross section view of an example of the initial structure in accordance with some embodiments, along the line A-A in FIG. 2A.

Referring to FIGS. 1, 2A and 2B, method 100 starts at step 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; and/or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of fin features 230 formed over the substrate 210. The fin feature 230 may include silicon (Si), silicon germanium (SiGe), silicon germanium tin (SiGeSn), gallium arsenic (GaAs), gallium phosphide (GaP), indium phosphide (InP), indium arsenide (InAs), and/or other suitable materials. In some embodiments, the fin feature 230 is formed by any suitable process including various deposition, photolithography, and/or etching processes. As an example, the fin feature 230 is formed by patterning and etching a portion of the substrate 210.

The initial structure 205 also includes a plurality of first conductive features 240 over the substrate 210. In some embodiments, the first conductive feature 240 may be gate structures including high-k/metal gate stacks (HK/MGs) wrapping over a portion of the fin features 230. Alternatively, in some embodiment, the first conductive feature 240 may also include a portion of the interconnect structure, such as a contact, a metal via, and/or metal line. In one embodiment, the first conductive features 240 include electrodes, capacitors, resistors and/or a portion of a resistor. For the purpose of simplicity and clarity, the first conductive feature 240 is referred to as the HK/MG 240.

The HK/MGs 240 may include gate dielectric layer and MG electrode layer. The gate dielectric layer of HK/MGs 240 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layers may be deposited by a suitable method, such as chemical vapor deposition (CVD), atomic layer deposition (ALD), thermal oxidation or ozone oxidation, other suitable technique, and/or a combination thereof.

The MG electrode layer may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. The MG may be formed by ALD, physical vapor deposition (PVD), CVD, and/or other suitable process.

In some embodiments, dummy gate stacks are formed first and then are replaced later by HK/MGs 240 after high thermal temperature processes are performed, such as thermal processes during sources/drains formation. The dummy gate stack may include a dummy gate dielectric layer and a polysilicon layer and may be formed by deposition, patterning and etching processes.

In some embodiments, a gate hard mask (HM) 245 is formed on top of each of the HK/MGs 240 to provide protection in subsequent etch processes. The gate HM 245 may include titanium (Ti), titanium oxide, TiN, TiSiN, tantalum (Ta), tantalum oxide, TaN, TaSiN, silicon nitride, silicon oxide, silicon carbide, silicon carbide nitride, manganese (Mn), cobalt (Co), ruthenium (Ru), WN, aluminum nitride, aluminum oxide, and/or other suitable material. The gate HM 245 may be formed by deposition, lithography patterning and etch processes.

In some embodiments, sidewall spacers 250 may be formed along the sidewalls of the HK/MGs 240. The sidewall spacers 250 may include a dielectric material such as silicon oxide, silicon nitride, silicon carbide, silicon oxynitride, and/or other suitable material. The sidewall spacers 250 may be formed by depositing a gate sidewall spacer layer and then anisotropic dry etching the gate sidewall spacer layer.

The initial structure 205 also may include second conductive features 260 over the substrate 210. In some embodiments, the second conductive features 260 are source/drain (S/D) features, beside and separated by the HK/MG 240. Alternatively, in some embodiment, the second conductive feature 260 may also include a portion of the interconnect structure, such as a contact, metal via, and/or metal line. In one embodiment, the first conductive features 260 include electrodes, capacitors, resistors or a portion of a resistor. For the purpose of simplicity and clarity, the second conductive feature 260 is referred to as the S/D features 260 hereinafter.

Here, one of the S/D features 260 is a source feature and another one of the S/D features 260 is a drain feature. As shown, the S/D features 260 are separated by the HK/MG 240. In one embodiment, a portion of the substrate 210, beside the HK/MG 240 is recessed to form S/D recesses and then the S/D features 250 are formed over the S/D recesses by epitaxial growing processes, such as CVD, VPE and/or UHV-CVD, molecular beam epitaxy, and/or other suitable processes.

The S/D features 260 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 260 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. After the S/D recesses are filled with the S/D feature 260, further epitaxial growth of a top layer of the S/D features 260 expands horizontally and facets may start to form, such as a diamond shape facets. The S/D features 260 may be in-situ doped during the epi processes. Alternatively, the S/D feature 260 is not in-situ doped, an implantation process (i.e., a junction implant process) is performed to dope the S/D feature 260. One or more annealing processes may be performed to activate dopants. The annealing processes comprise rapid thermal annealing (RTA) and/or laser annealing processes.

In the present embodiment, the initial structure 205 includes a dielectric layer 270 deposited over the substrate 210. As shown, the dielectric layer 270 is formed such that it fully fills in spaces between HK/MGs 240 and such that the S/D features 260 are embedded in the dielectric layer 270. The dielectric layer 270 may include silicon oxide, a dielectric material having a dielectric constant (k) lower than thermal silicon oxide (therefore referred to as low-k dielectric material layer), and/or other suitable dielectric material layer. The dielectric layer 270 may include a single layer or multiple layers. The first dielectric layer 260 may be deposited by CVD, ALD or spin-on coating. In some embodiments, the dielectric layer 270 is different from the sidewall spacer 250 and the gate HM 245 to achieve etching selectivity during a subsequent etch as described in more detail below. For example, the dielectric layer 270 includes silicon oxide while both of the sidewall spacer 250 and the gate HM 245 include silicon nitride.

Figure 3A:
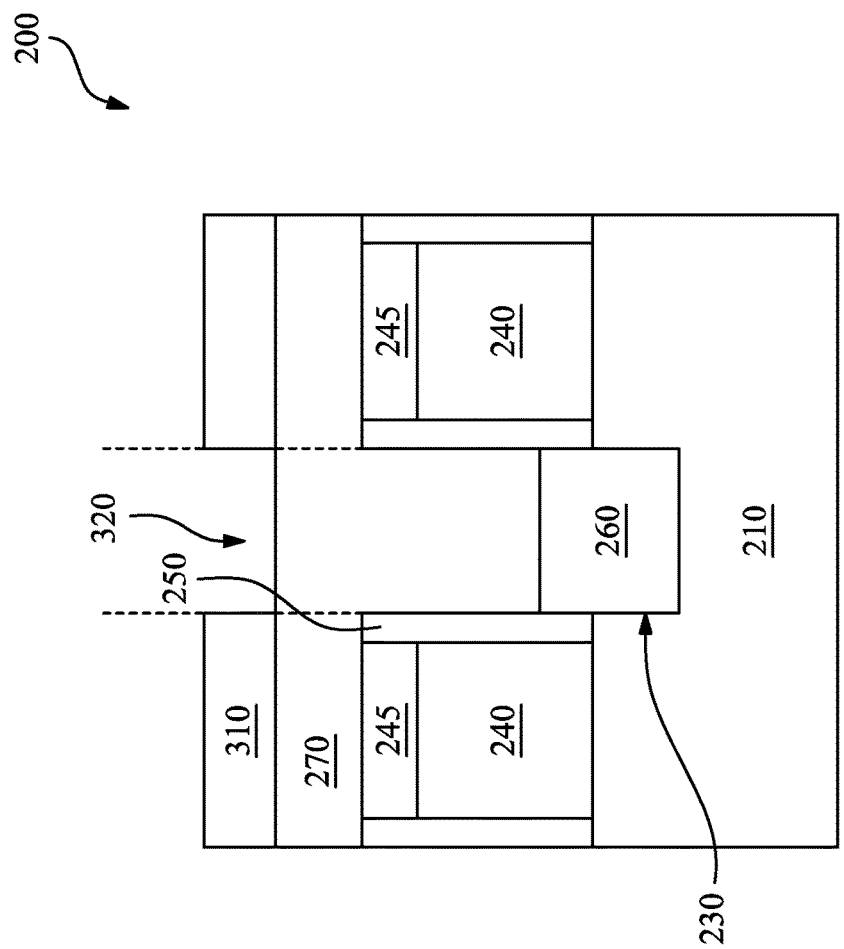

Referring to FIGS. 1 and 3A, once the initial structure 205 is received, method of 100 proceeds to step 104 by forming a HM 310 having an opening 320 over the dielectric layer 270. Designated S/D features 260 are within opening 320. In some embodiments, edges of the opening 320 align to respective edges of the sidewall spacers 250 toward to designated S/D features 250, as shown in FIG. 3A. Alternatively, in some embodiments, as shown in FIG. 3B, the opening 320 has a larger width such that it extends to adjacent HK/MGs 240 (with the gate HM 245) to obtain advantages, such as relaxing lithography process resolution constrains.

In one embodiment, the HM 310 is a patterned photoresist layer. In another embodiment, the HM 310 is formed by depositing a HM layer over the dielectric layer 270, depositing photoresist layer over the HM layer, patterning the photoresist layer, then etching the HM layer through patterned photoresist layer to pattern the HM layer and then etching the HM 310 through the patterned HM layer to form the opening 320 in the HM 310.

Figure 4A:
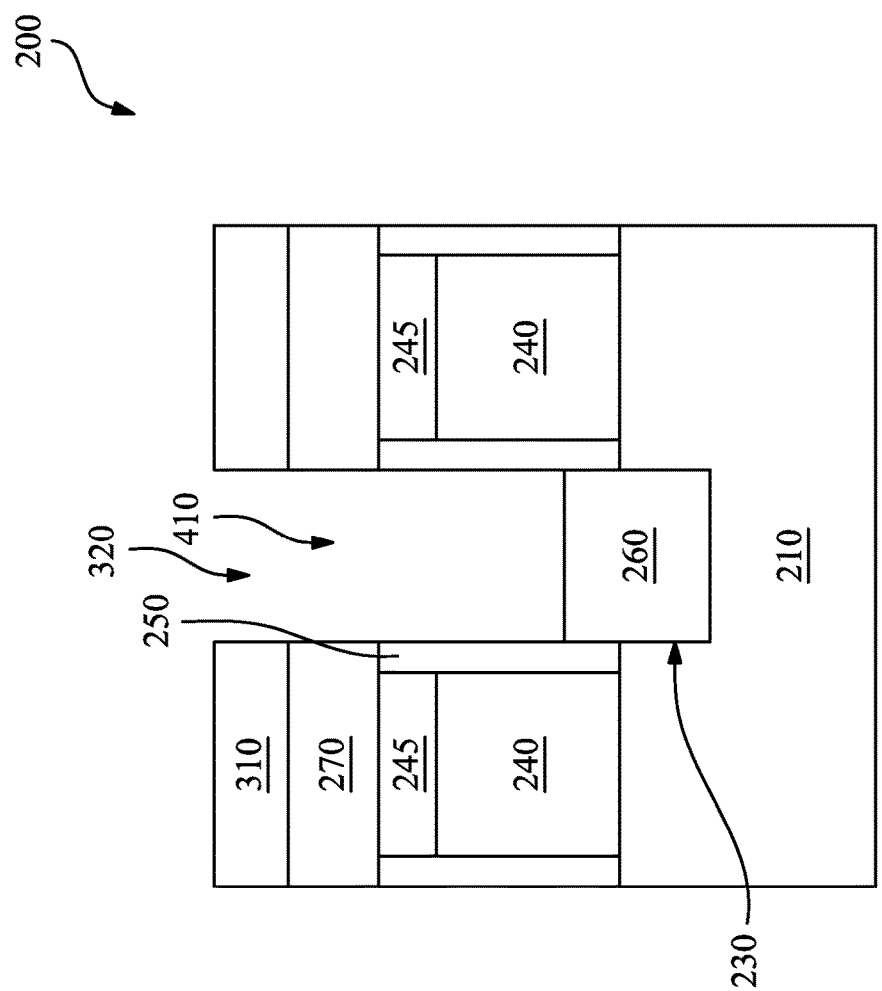

Referring to FIGS. 1 and 4A, method 100 proceeds to step 106 by etching the dielectric layers 270 through the opening 320 to form a contact trench 410 and the S/D features 260 are exposed in the contact trench 410. The trench etch may include a wet etch, a dry etch, and/or a combination thereof. As an example, the trench etch includes a plasma dry etching process using a fluorine-based chemistry, such as $CF_4$, $SF_6$, $CH_2F_2$, $CHF_3$, and/or $C_2F_6$. The respective etch process may be tuned with various etching parameters, such as etchant used, etching temperature, etching solution concentration, etching pressure, etchant flow rate, and/or other suitable parameters.

Figure 3B:
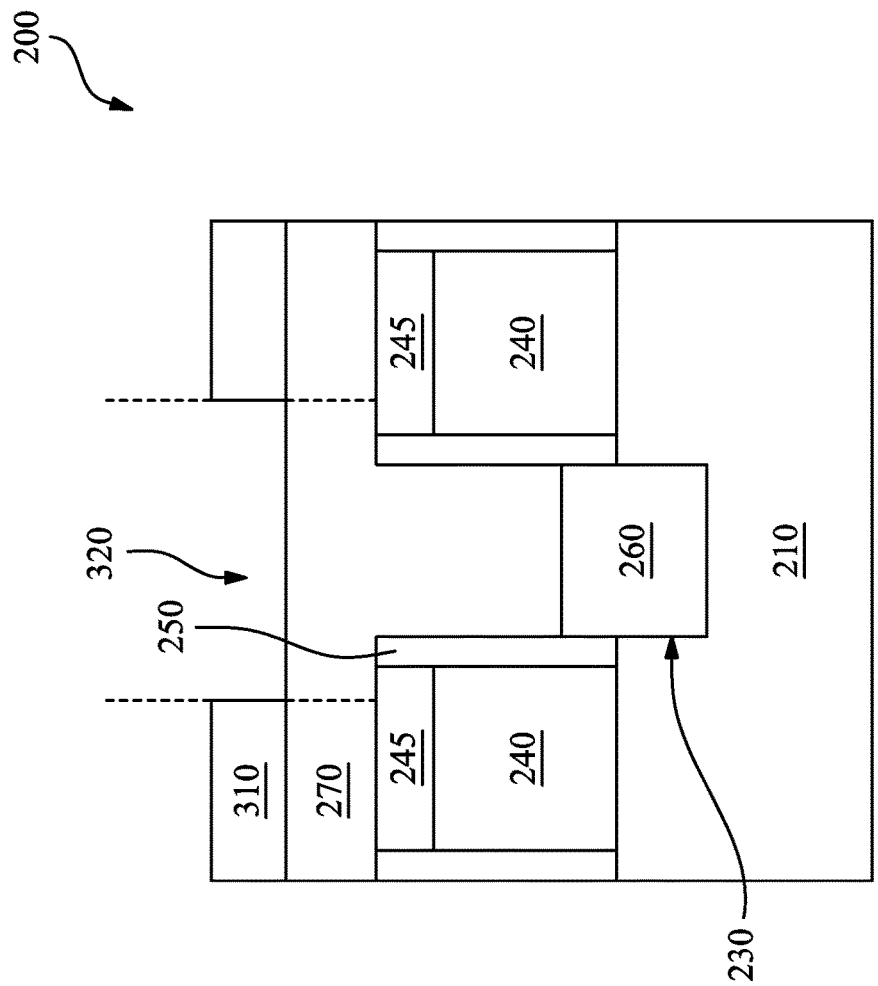
Figure 4B:
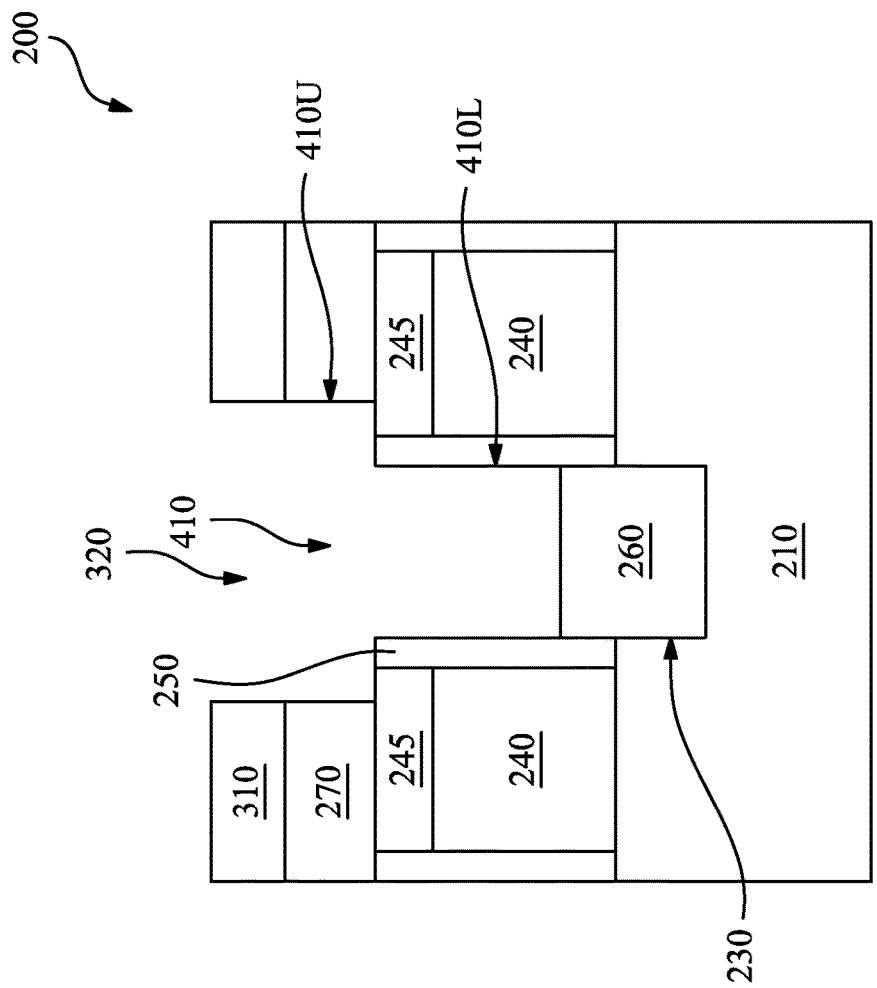

As shown, for circumstances where the adjacent gate HM 245 are exposed in the same second opening 320 (as shown in FIG. 3B), the trench etch process is chosen to selectively etch the dielectric layers 270 without substantially etching the gate HM 245 and the sidewall spacer 250, as shown in FIG. 4B. Accordingly, the adjacent HK/MG 240 is protected by the gate HM 245 and the sidewall spacers 250 during the etching process. In other words, the exposed portions of the gate HM 245 and the sidewall spacer 250 serve as a sub-etch-mask. As a result, the contact trench 410 includes an upper portion 410U and a lower portion 410L. The upper portion 410U is wider than the lower portion 410L.

After forming the contact trench 410, the HM 310 is removed by another etch process. In one example where the HM 310 is a photoresist pattern, the HM 310 is removed by wet stripping and/or plasma ashing.

Figure 5A:
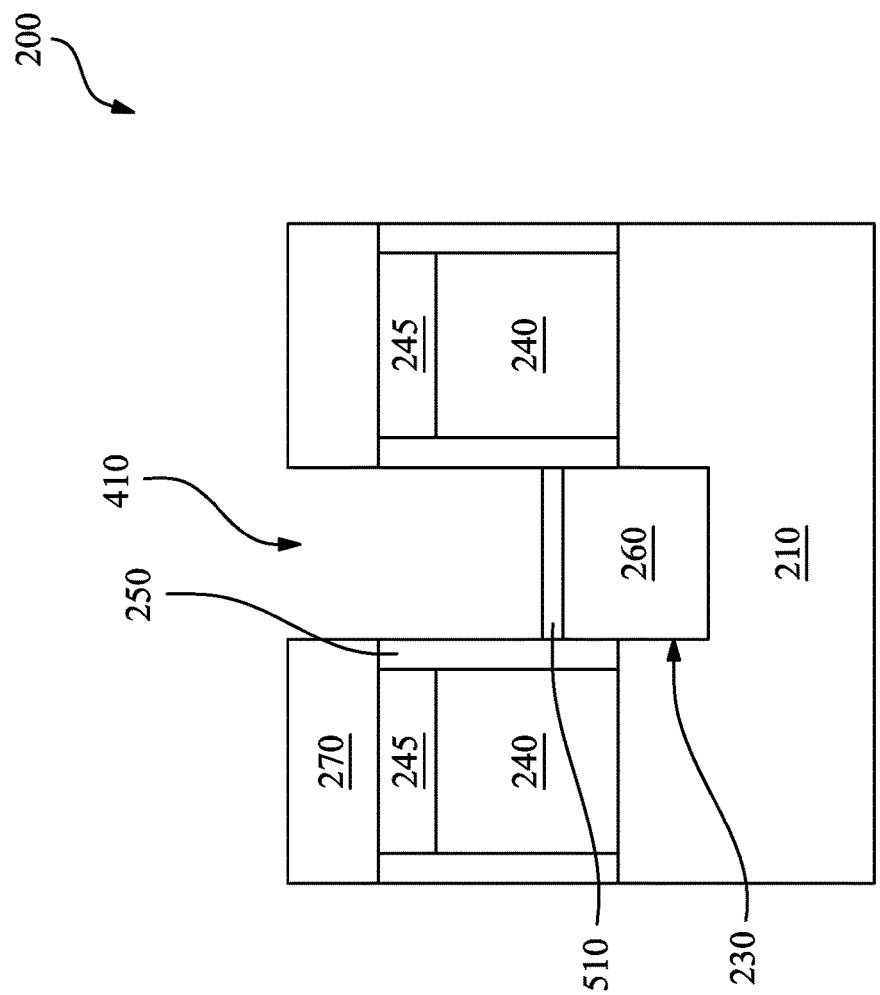
Figure 5B:
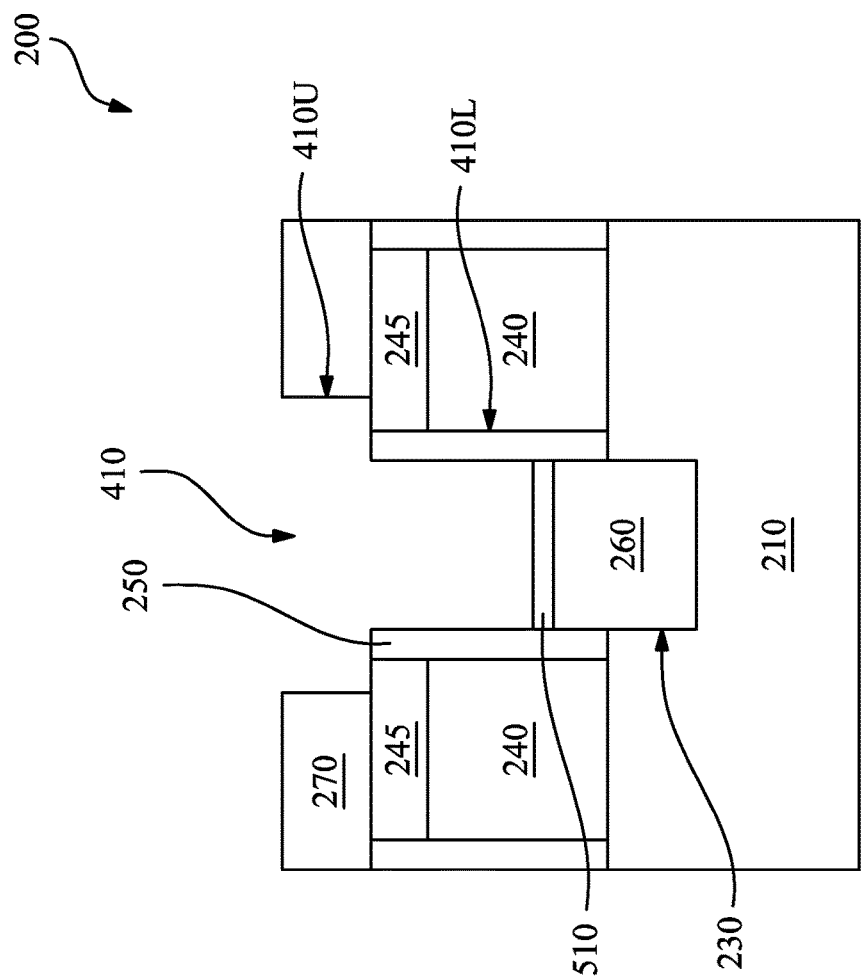

Referring to FIGS. 1, 5A ((in conjunction with the process described with respect to FIG. 4A) and 5B (in conjunction with the process described with respect to FIG. 4B), method 100 proceeds to step 107 by forming a silicide layer 510 over the exposed S/D features 260 to reduce the contact resistance. In some embodiments, the silicide layer 510 is formed over the top surface of the S/D features 260. The silicide layer 510 may include such materials as nickel silicide, cobalt silicide, tungsten silicide, tantalum silicide, titanium silicide, platinum silicide, erbium silicide, palladium silicide, and/or combinations thereof. The silicide layer 510 may be formed by silicidation such as self-aligned silicide (Salicide), in which a metal is deposited, reacted with silicon during an annealing process, and then the unreacted metal is removed by etch. Particularly, after the metal deposition, temperature is raised to for annealing to enhance reaction between Si and metal to form silicide, finally unreacted metal may be etched away. Annealing may be one step or multi-step annealing depending on metal material and other conditions. Alternatively, the silicide layer 510 may be formed by a procedure including silicide deposition, such as CVD, PVD, or ALD.

As an example, the deposited metal layer includes titanium (Ti). After the metal deposition (e.g. Ti), an annealing process is applied to react the metal (e.g. Ti) with silicon of the S/D features 260, thereby forming the silicide layer 510, such as Ti silicide (TiSi). An etching process then follows to remove unreacted Ti layer.

Typically, a metal layer will be filled in the contact trench 410 to form a contact metal for providing electric connection with one of underlayer features such as S/D features 260. In advanced technology nodes of integrated circuit industry, the critical dimensions of semiconductor devices become smaller and smaller. Contact resistance plays an important factor on device performance, such as boosting $I_{on}/I_{off}$ performance. To reduce contact resistance, a low resistivity metal layer having good adhesion ability with sidewalls/bottom of the contact trench is desired. As an example, a resistivity of cobalt (Co) metal, 62.4 nΩ·m, is much lower than resistivity of tungsten (W) metal, 52.8 nΩ·m. It is a challenge to deposit such a low resistivity metal layer experiencing a good adhesion and good conformity in the contact trench 410, especially as devices scale down such that aspect ratio of the contact trench 410 become higher and higher. To address this issue, the present disclosure provides methods of forming a metal layer within the contact trench with good adhesion ability and conformity.

Figure 6A:
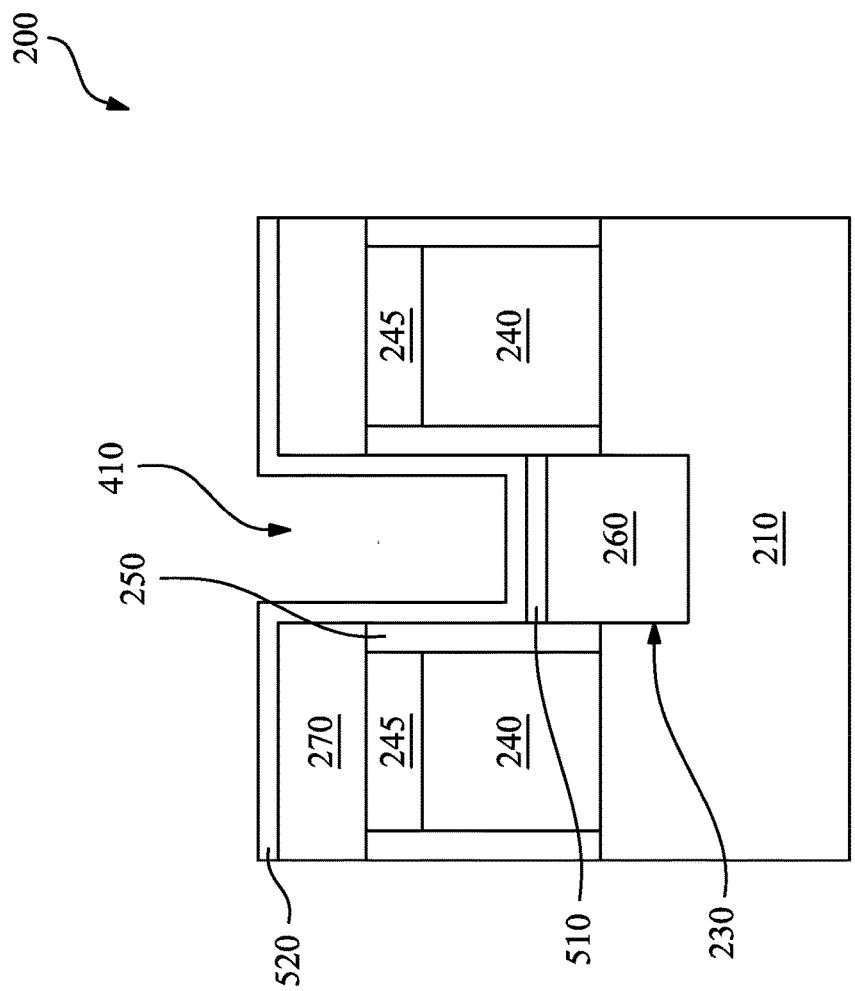

Referring to FIGS. 1, 6A (in conjunction with the process described with respect to FIG. 5A), and 6B (in conjunction with the process described with respect to FIG. 5B), method 100 proceeds to step 110 by forming an adhesion layer 520 along sidewalls of the contact trench 410 and extends within the contact trench 410 toward S/D features 260. The adhesion layer 520 is chosen to have adequate adhesion ability to metal layers to be filled in the contact trench 410. In the present embodiment, the metal layer to be filled in the contact trench 410 includes cobalt (Co) layer and the adhesion layer 520 for the Co layer includes titanium nitride (TiN). The TiN adhesion layer 520 is chosen such that it has quite a thin thickness, which allows the to-be-filled-in Co layer to obtain a larger volume and results in a lower contact resistance. The TiN adhesion layer 520 is also chosen to have high film density and a low ratio of oxygen to titanium at its surface to enhance adhesion ability with the to-be-filled-in Co layer. In an embodiment, a thickness of the TiN adhesion layer 520 is less than 30 angstroms, a density of about 4.75 g/cm$^3$ and a ratio of oxygen to titanium (O/Ti) that is less than 0.5. The TiN adhesion layer 520 is formed conformably along sidewalls and bottom of the contact trench 410 with conformity greater than 90%. Here, conformity refers to a comparison of the thickness of the film along the bottom of the trench versus the thickness of the film along the sidewall of the trench.

In an embodiment, the TiN adhesion layer 520 is deposited by an ALD process with a tetrakis (dimethylamino) titanium (TDMAT)/TiCl$_4$ precursor carried by precursor carrier gases of mixture of argon, helium and nitrogen. The deposition process includes a process temperature ranging from 200 C to 450 C and a deposition pressure ranging from 0.5 torr to 10 torr.

The adhesion layer 520 may also include tantalum nitride (TaN), tungsten nitride (WN), titanium silicon nitride (TiSiN) or tantalum silicon nitride (TaSiN), and/or other materials and be deposited by CVD, PVD, metal-organic chemical vapor deposition (MOCVD), plating, and/or other techniques.

Figure 6B:
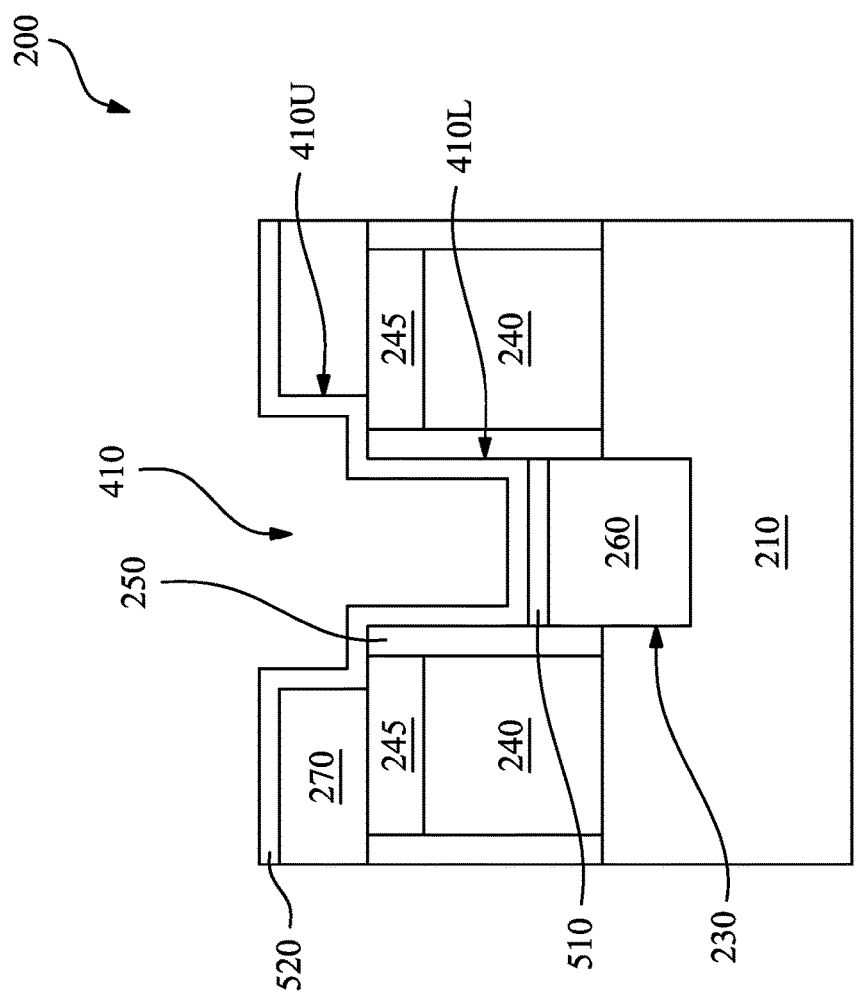

As shown, for circumstances where the contact trench 410 is formed with the upper portion 410U and the lower portion of 410L (as shown in FIG. 4B), the adhesion layer 510 is deposited along sidewalls of the upper portion 410U as well, as shown in FIG. 6B.

Figure 7B:
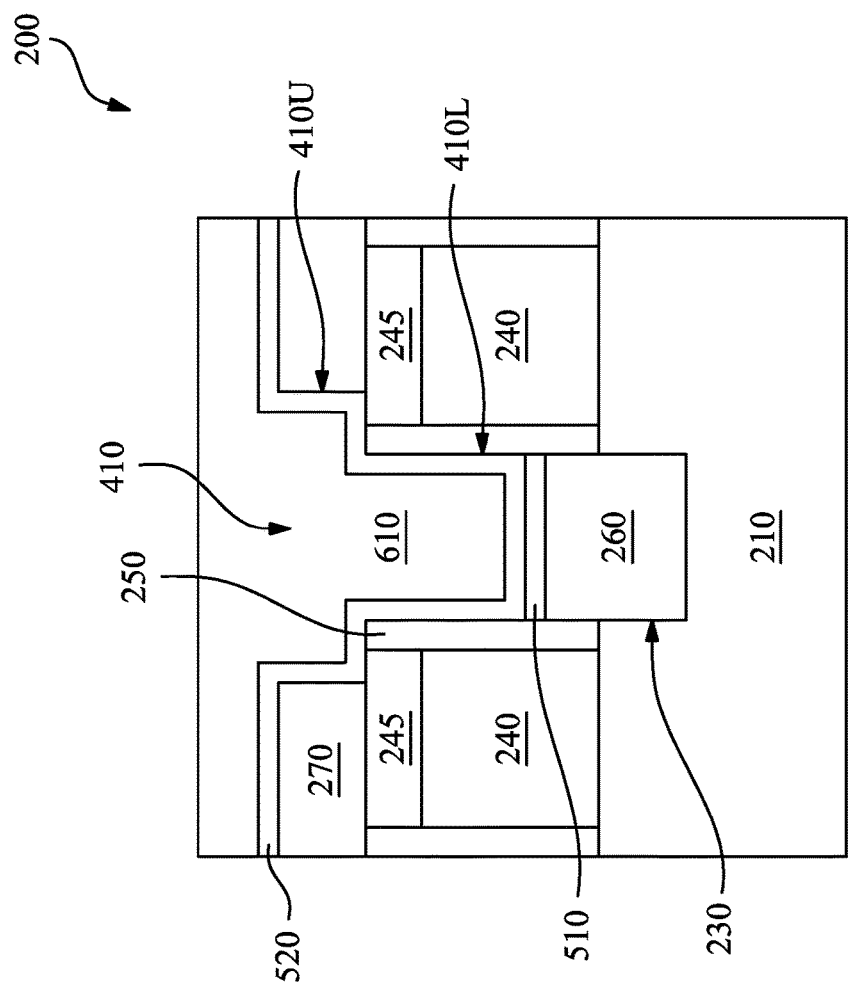

Referring to FIGS. 1, 7A (in conjunction with the process described with respect to FIG. 6A) and 7B (in conjunction with the process described with respect to FIG. 6B), method 100 proceeds to step 110 by forming a metal layer 610 over the adhesion layer 520 in the contact trench 410. In the present embodiment, the conductive layer 610 includes a Co layer. In an embodiment, a Co seed layer is deposited over the TiN adhesion layer 520 first by ALD process for a good conformal deposition and followed by a bulk-cobalt PVD process to fill the contact trench 410 via a high deposition rate. In an embodiment, the Co seed layer has a thickness ranging from 5 A to 100 A. In the present embodiment, to the Co layer 610, the TiN adhesion layer 520 not only demonstrates a characteristic of good adhesion but also demonstrates improvement of electromigration resistance.

Alternatively, the metal layer 610 may include copper (Cu), copper, copper magnesium (CuMn), copper aluminum (CuAl) or copper silicon (CuSi), aluminum (Al), tungsten (W), and/or other suitable conductive material. The metal layer 610 may be deposited by ALD, PVD, CVD, metal-organic chemical vapor deposition (MOCVD), plating, and/or other techniques.

Figure 8A:
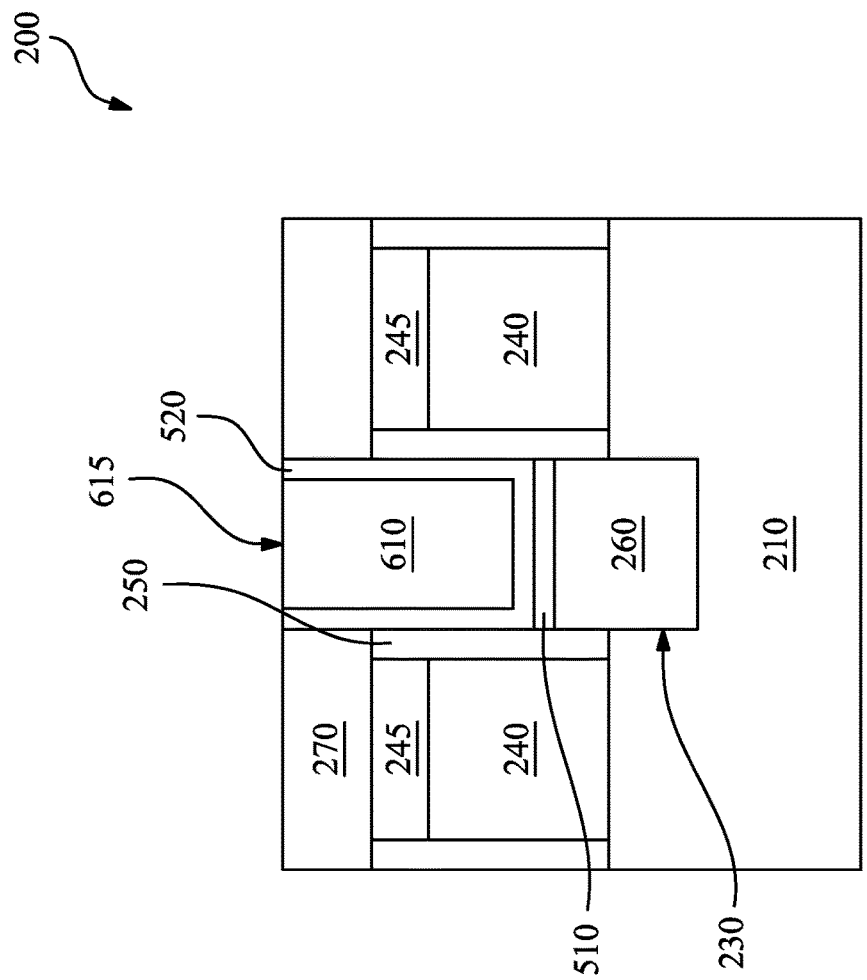

Additionally, the metal layer 610 may be recessed, as well as the adhesion layer 520 over the dielectric layer 270, to provide a planar topography for subsequent processes, such as a lithography process, as shown in FIG. 8A (in conjunction with the process described with respect to FIG. 7A). In some embodiments, a CMP process is performed to remove excessive the metal layer 610 and the adhesion layer 520. The remaining metal layer 610 in the contact trench 410 forms a contact metal 615.

Figure 8B:
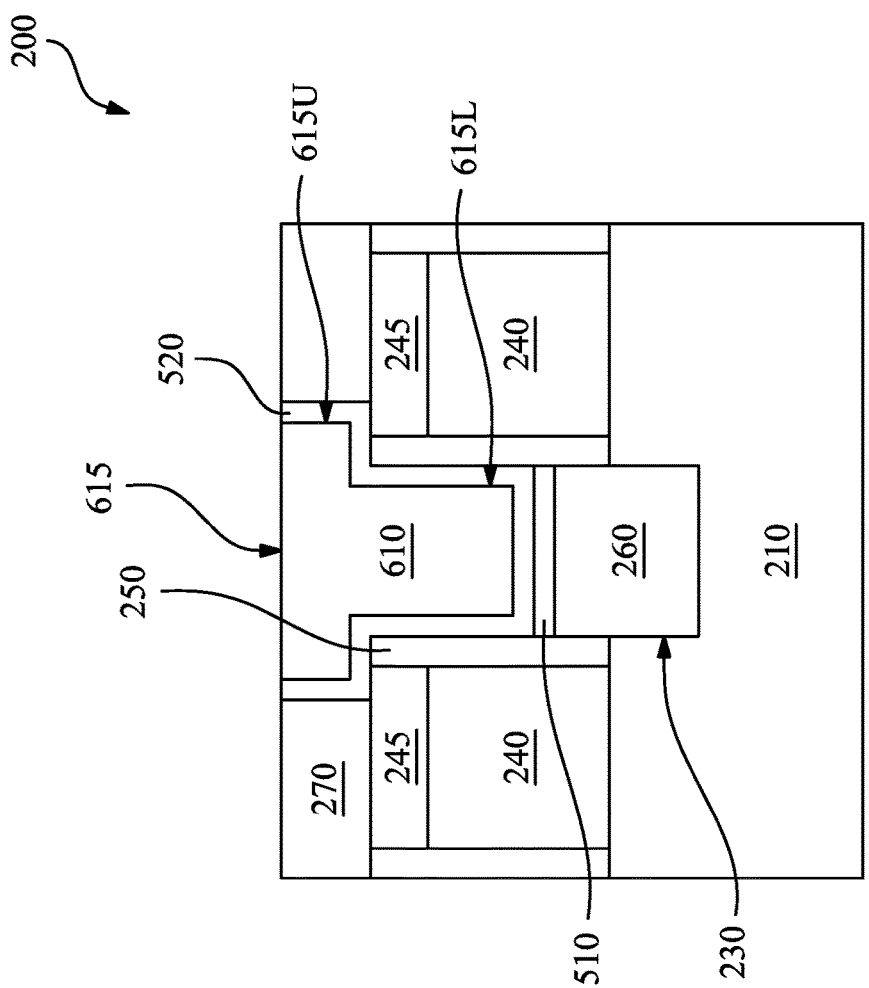

As shown, for circumstances where the contact trench 410 is formed with the upper portion 410U and the lower portion of 410L (in conjunction with the process described with respect to FIG. 7B), the contact metal 615 has an upper portion 615U and a lower portion 615L, as shown in FIG. 8B. A width of the upper portion 615U is greater than the lower portion 615L.

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of forming a cobalt contact metal. Prior to forming the Cobalt layer with in a contact trench, the method employs forming a thin ALD TiN to enhance adhesion ability and improve electromigration resistance. The method provides a robust butted contact metal formation process to reduce contact resistance.

The present disclosure provides many different embodiments of fabricating a semiconductor device that provide one or more improvements over existing approaches. In one embodiment, a method for fabricating a semiconductor device includes forming a source/drain feature over a substrate, forming a dielectric layer over the source/drain feature, forming a contact trench through the dielectric layer to expose the source/drain feature, depositing a titanium nitride (TiN) layer by a first atomic layer deposition (ALD) process in the contact trench and depositing a cobalt layer over the TiN layer in the contact trench.

In yet another embodiment, a method includes forming a first gate stack and a second gate stack over a substrate, forming a source/drain feature over the substrate. The source/drain feature is disposed between the first and second gate stacks. The method also includes forming a dielectric layer over the source/drain feature, forming a contact trench through the dielectric layer to expose the source/drain feature, forming a self-aligned silicide layer over the exposed source/drain feature and depositing a titanium nitride (TiN) layer by a first atomic layer deposition (ALD) process in the contact trench, including over the self-aligned silicide layer. The method also includes depositing a cobalt layer over the TiN layer in the contact trench.

In yet another embodiment, a semiconductor device includes forming a dielectric layer over a substrate, forming a trench in the dielectric layer, forming a titanium nitride layer by a first atomic layer deposition (ALD) process in the trench and forming a cobalt layer over the titanium nitride layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a source/drain feature disposed on a substrate;
a silicide layer disposed on the source/drain feature;
a dielectric layer disposed over the substrate;
a first gate stack comprising a conductive feature disposed between the dielectric layer and the substrate;
a first sidewall spacer disposed under the dielectric layer and physically contacting a sidewall of the conductive feature of the first gate stack;
a titanium nitride (TiN) layer extending along a sidewall of the dielectric layer and the first sidewall spacer to the silicide layer, wherein the TiN layer physically contacts a top surface of the silicide layer facing away from the substrate, a side surface of the dielectric layer, and the first sidewall spacer, wherein a comparison of a thickness of the TiN layer over the top surface of the silicide layer versus a thickness of the TiN layer along the sidewall of the dielectric layer and the first sidewall spacer is greater than 90%; and
a metal layer extending along the TiN layer.

2. The device of claim 1, wherein the TiN layer physically contacts the first sidewall spacer.

3. The device of claim 2, wherein the first sidewall spacer extends to the source/drain feature.

4. The device of claim 2, wherein the first sidewall spacer extends to the silicide layer.

5. The device of claim 1, further comprising:
a second gate stack disposed between the dielectric layer and the substrate; and
a second sidewall spacer disposed along a sidewall of the second gate stack.

6. The device of claim 5, wherein the silicide layer extends from the first sidewall spacer to the second sidewall spacer.

7. The device of claim 5, wherein the TiN layer extends from the first sidewall spacer to the second sidewall spacer.

8. The device of claim 1, wherein the metal layer comprises an upper portion and a lower portion, and a width of the upper portion is greater than a width of the lower portion.

9. A device comprising:
a first gate stack comprising a first conductive feature and a second gate stack comprising a second conductive feature disposed over a substrate;
a first sidewall spacer disposed over the substrate and along a sidewall of the first conductive feature of the first gate stack and a second sidewall spacer disposed over the substrate and along a sidewall of the second conductive feature of the second gate stack;
a source/drain feature disposed over the substrate between the first and second gate stacks;
a dielectric layer disposed over the substrate and the first and second gate stacks;
a silicide layer disposed directly on the source/drain feature;
a titanium nitride (TiN) layer extending through a sidewall of the dielectric layer and the first and second sidewall spacers to the silicide layer to form a trench, wherein the TiN layer physically contacts a top surface of the silicide layer facing away from the substrate, a side surface of the dielectric layer, and the first and second sidewall spacers, wherein a comparison of a thickness of the TiN layer along a bottom of the trench versus a thickness of the TiN layer along a sidewall of the trench is greater than 90%; and
a conductive layer filling in the trench formed by the TiN layer.

10. The device of claim 9, wherein the conductive layer includes cobalt.

11. The device of claim 9, wherein the TiN layer has a ratio of oxygen to titanium (O/Ti) at its surface is less than 0.5.

12. The device of claim 9, wherein the TiN layer has a density of more than 4.75 g/cm$^3$.

13. The device of claim 9, wherein the silicide layer includes titanium silicon (TiSi).

14. The device of claim 9, wherein the conductive layer includes first and second metal layers.

15. The device of claim 9, wherein the trench comprises an upper portion and a lower portion, and a width of the upper portion is greater than a width of the lower portion.

16. A device comprising:
a source/drain feature disposed over a substrate;
a first gate stack comprising a first conductive feature and a second gate stack comprising a second conductive feature formed over the substrate, wherein the source/drain feature is disposed between the first and second gate stacks;
a first sidewall spacer disposed over the substrate along a sidewall of the first conductive feature of the first gate stack and a second sidewall spacer disposed over the substrate along a sidewall of the second conductive feature of the second gate stack, wherein the first sidewall spacer has a first inner edge facing the first conductive feature and an opposing first outer edge that faces away from the first conductive feature;
a dielectric layer disposed over the substrate;
a self-aligned silicide layer disposed directly on the source/drain feature, wherein both the self-aligned silicide layer and the source/drain feature physically contact the first outer edge of the first sidewall spacer;
a titanium nitride (TiN) layer extending along the dielectric layer and the first and second sidewall spacers such that the TiN layer is disposed on the self-aligned silicide layer, wherein the TiN layer physically contacts a top surface of the self-aligned silicide layer facing away from the substrate, a side surface of the dielectric layer, and the first and second sidewall spacers; and
a metal layer disposed on the TiN layer.

17. The device of claim 16, wherein the TiN layer has:
a thickness ranging from 5 Å to 100 Å;
a ratio of oxygen to titanium (O/Ti) at that is less than 0.5; and
a density of more than 4.75 g/cm$^3$.

18. The device of claim 16, wherein the metal layer includes cobalt.

19. The device of claim 16, wherein the metal layer comprises an upper portion and a lower portion, and a width of the upper portion is greater than a width of the lower portion.

20. The device of claim 16, wherein the TiN layer extending along the dielectric layer and the first and second sidewall spacers forms a trench, and
wherein a comparison of a thickness of the TiN layer along a bottom of the trench versus a thickness of the TiN layer along a sidewall of the trench is greater than 90%.

* * * * *